United States Patent
Ku

(12) United States Patent (10) Patent No.: US 6,384,331 B1
(45) Date of Patent: May 7, 2002

(54) SECURED REINFORCING SUPPORT DEVICE FOR A HEAT SINK

(75) Inventor: Joseph Ku, Chung-Ho (TW)

(73) Assignee: Micro-Star Int'l Co., Ltd., Chung-Ho (TW)

( * ) Notice: Subject to any disclaimer, the term of this patent is extended or adjusted under 35 U.S.C. 154(b) by 0 days.

(21) Appl. No.: 09/824,336

(22) Filed: Apr. 2, 2001

(30) Foreign Application Priority Data

Jan. 8, 2001 (TW) .................................. 090200310 U

(51) Int. Cl.[7] .............................. H05K 5/00; H05K 7/20; H01L 23/34
(52) U.S. Cl. .................... 174/52.1; 361/707; 361/709; 361/719; 257/707; 257/719
(58) Field of Search ................... 174/52.1; 361/688, 361/704, 707, 709, 710, 711, 717, 718, 719, 722; 257/706, 707, 712, 713, 718, 719

(56) References Cited

U.S. PATENT DOCUMENTS

| | | | | |
|---|---|---|---|---|
| 4,563,725 A | * | 1/1986 | Kirby | ........................ 174/16.3 |
| 5,880,930 A | * | 3/1999 | Wheaton | .................... 165/80.3 |
| 6,049,469 A | * | 4/2000 | Hood et al. | ................ 174/35 R |
| 6,055,159 A | * | 4/2000 | Sun | .............................. 165/185 |
| 6,212,074 B1 | * | 4/2001 | Gonsalves et al. | ........... 165/185 |
| 6,243,268 B1 | * | 6/2001 | Kang et al. | ............. 165/104.21 |

* cited by examiner

*Primary Examiner*—Dean A. Reichard
*Assistant Examiner*—Carmelo Oliva
(74) *Attorney, Agent, or Firm*—Brinks Hofer Gilson & Lione

(57) ABSTRACT

A secured reinforcing support device includes a reinforcing support plate disposed between a motherboard and a bottom wall surface of a computer casing and adapted to bear the mass of a heat sink superimposed on a central processing unit mounted on the motherboard. A support post extends from the bottom wall surface of the computer casing through a surrounding area of the support plate to abut against the motherboard. A bracing member extends upwardly and integrally from the surrounding area of the support plate to be disposed on and spaced apart from an upper surface of the motherboard. A tightening shaft passes through a through bore in the bracing member and through an insert hole in the motherboard into a fastening bore in the support post to thereby reinforce connection among the motherboard, the support plate and the computer casing.

8 Claims, 2 Drawing Sheets

SECURED REINFORCING SUPPORT DEVICE FOR A HEAT SINK

BACKGROUND OF THE INVENTION

1. Field of the Invention

The invention relates to a reinforcing support device for a heat sink, more particularly to a secured reinforcing support device which is secured on a computer casing to help bear the mass of a heat sink that is used to absorb and dissipate heat from a central processing unit of a computer.

2. Description of the Related Art

The development of personal computers in recent years has been very fast. With the increase in the functions and operational speed of the computer, the central processing unit is likely to generate large amounts of heat during operation thereof, which can lead to failure of the computer or damage to the electronic components. In order to dissipate the heat generated by the central processing unit during operation, a heat sink is generally mounted on the central processing unit. The same problem exists with other chip devices. In a conventional heat sink mounting structure for a chip device, a heat-conductive gel is used to adhere the heat sink directly onto the chip device, or a mechanical device is used to fasten the heat sink to the chip device. In both cases, the mass or weight of the heat sink is borne by a motherboard on which the chip device is mounted. If the heat sink is relatively heavy, the weight of the heat sink may be a significant load to the motherboard and may result in damage to the motherboard. As the latest Intel Pentium 4 (P4) central processing unit operates at a very high speed, it requires a heat sink with a relatively large heat dissipation area and consequently has a greater weight (about 0.45 kg). In view of this, Intel has required compatible computer casings to be provided with four threaded through holes for passage of threaded fasteners to secure the P4-specific heat sink thereon so that the load of the heat sink can be largely borne by the casing.

However, standard computer casings, such as ATX computer casings, are not provided with such threaded through holes for mounting of the P4-specific heat sink. Therefore, there are available heat sink device mounting structures compatible with the P4-specific heat sink for computer casings not provided with four threaded through holes. One of such structures is shown in FIGS. 1 and 2. The heat sink device as shown includes a heat sink 61 having a plurality of fins 611 in contact with a top surface of a CPU 60 for absorbing the heat generated by the CPU 60. The CPU 60 is mounted on an upper surface of a motherboard 64 via a socket 601 disposed below the CPU 60. The heat sink device further includes a cooling fan 62 secured on an upper surface of the heat sink 61 to help dissipate the heat absorbed by the heat sink 61. The heat sink 61 further has two opposite bottom edges respectively provided with grooves 612. The structure further includes two plastic positioning seats 63, each of which has a fastening rod 631 pivotally mounted at one end thereof and abutting against the corresponding groove 612 to thereby retain the positioning seats 63 at lower edges of the grooves 612 of the heat sink 61. Each positioning seat 63 has a bottom wall formed with two round through holes 632 for passage of two hollow rod members 633, each of which has a lower end forming a split tapered portion 634 that extends downwardly through a corresponding hole 641 in the motherboard 64 to abut against a bottom wall surface of a computer casing 65. Plastic press pins 635 are inserted downwardly into the hollow rod members 633 to thereby expand the split tapered portion 634 such that the hollow rod members 633 are in tight engagement with the walls of the holes 641 in the motherboard 64. As such, the heat sink device can be mounted above the CPU 60 via the positioning seats 63.

Although the above-described heat sink device mounting structure enables the heat sink device to be supported on the bottom wall surface of the computer casing 65, any undue impact or vibration may cause the press pins 635 to slip out of the rod members 633, thereby resulting in loosening of the heat sink device on the CPU 60 or even falling of the heat sink device onto the motherboard 64. Electronic components (not shown) on the motherboard 64 are therefore likely to be damaged.

With reference to FIG. 3, there is also available another type of heat sink device mounting structure in which a relatively heavy iron plate 76 is disposed between and parallel to a motherboard 74 and a bottom wall surface of a computer casing 75. The plate 76 is provided with two pairs of mounting posts 761 projecting from an upper surface thereof for threaded engagement with two pairs of screw bolts 733 extending downwardly through holes 732 in positioning seats 73 of the heat sink device. A plurality of threaded rods 762 extend upwardly from the upper surface of the plate 76 at a peripheral portion. Upper ends of the threaded rods 762 are retained in holes 741 in the motherboard 74. Thus, the plate 76 is suspendedly secured below the motherboard 74, whereas the motherboard 74 is secured on the computer casing 75 through use of screw bolts 742 that engage threaded holes 743 in the motherboard 74 and internally threaded copper posts 751 provided on the bottom wall surface of the computer casing 75. Although the plate 76 helps secure the heat sink device, it is suspended below the motherboard 74 and is not secured directly on the computer casing 75. Thus, the load of the heat sink device and any impact thereon are substantially borne by the motherboard 74.

SUMMARY OF THE INVENTION

Therefore, the main object of the present invention is to provide a secured reinforcing support device for a heat sink of a computer.

Accordingly, a secured reinforcing support device according to the present invention helps bear the mass of a heat sink used for absorbing and dissipating heat from a central processing unit of a computer. The computer further includes: a motherboard which has first upper and lower major surfaces opposite to each other in an upright direction, the first upper major surface having a loaded area and a peripheral area surrounding the loaded area, a central processing unit being mounted on the loaded area; a heat sink disposed to be spaced apart from the loaded area in the upright direction and superimposed on the central processing unit to absorb and dissipate heat therefrom; a seat mount disposed to bear and localize the heat sink in the loaded area; and a casing for housing the motherboard, including a bottom major wall surface disposed under the first lower major surface and spaced apart from the first lower major surface in the upright direction to form an accommodation space. The secured reinforcing support device includes a reinforcing support plate, a support post, an inner peripheral wall, a bracing member and a tightening shaft. The reinforcing support plate is adapted to be disposed in the accommodation space. The reinforcing support plate includes second upper and lower major surfaces opposite to each other in the upright direction and adapted to be respectively spaced apart from the first lower major surface and the bottom major wall surface. The second upper major surface includes central and surrounding areas, which are adapted to respectively correspond to and be positioned under the loaded area and the peripheral area. The central area is further adapted to support and be connected to the seat mount through the loaded area. The surrounding area includes a through hole extending downward to communicate with the second lower major surface. The support post includes a lower end adapted to be secured to the bottom major wall surface, and an upper end extending from the lower end upwardly and in the upright direction. The upper end is dimensioned to pass through the through hole so as to abut against the first lower major surface, and has a fastening bore which extends axially and towards the lower end and which defines an axis. The inner peripheral wall is adapted to be disposed in the motherboard to define an insert hole which extends along the axis to communicate the first upper major surface with the first lower major surface. The bracing member includes a joining end disposed to be integrally formed with the reinforcing support plate at the surrounding area, and a clamped portion with a clamped end. The clamped portion extends from the joining end upwardly and in the upright direction such that the clamped end is adapted to be disposed on the first upper major surface and adjacent to the inner peripheral wall. The tightening shaft passes through the insert hole and is disposed to be threadedly engaged with the fastening bore such that when the tightening shaft is in full engagement with the insert hole, the clamped end is forced to abut against the first upper major surface.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
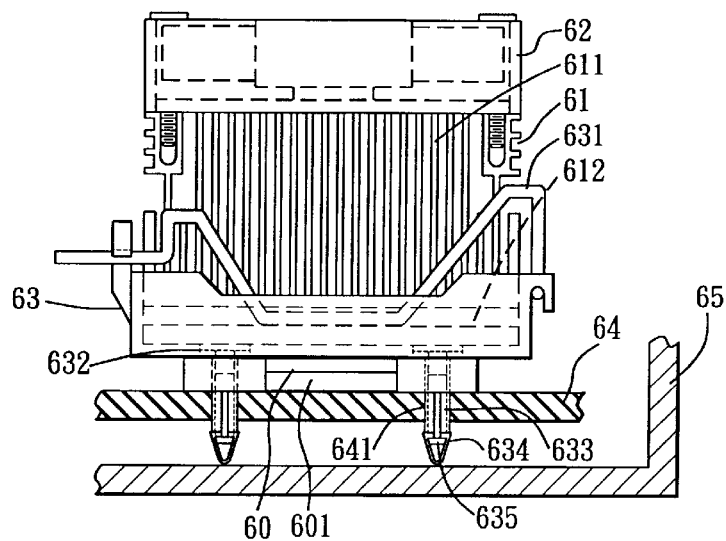
FIG. 1 is a fragmentary side view illustrating a conventional heat sink device mounting structure, showing its relationship among a heat sink device, a motherboard and a computer housing.
Figure 2:
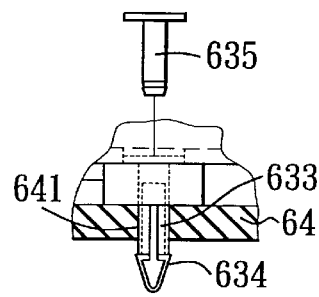
FIG. 2 is a fragmentary side view illustrating how a press pin engages a hollow rod member in the motherboard of FIG. 1.
Figure 3:
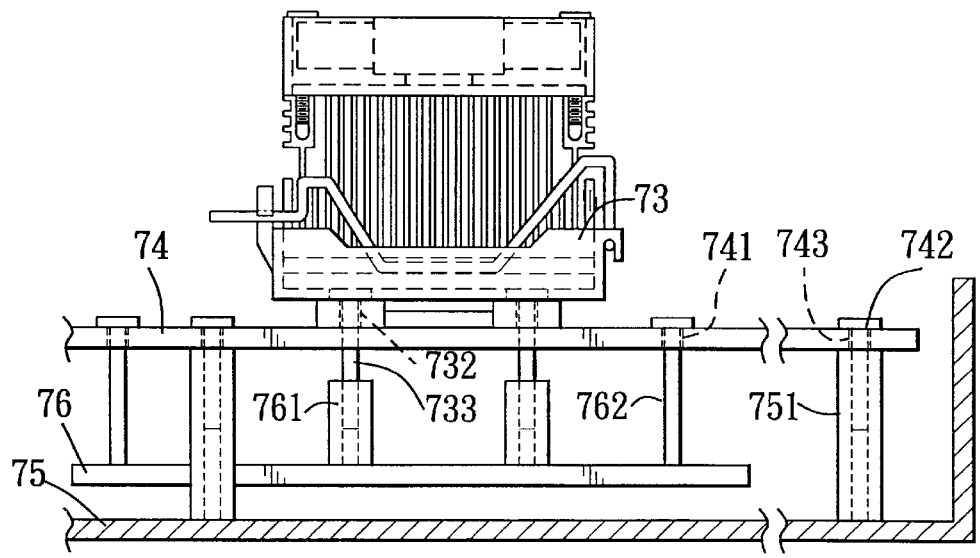
FIG. 3 is a fragmentary side view of another conventional heat sink device mounting structure.
Figure 4:
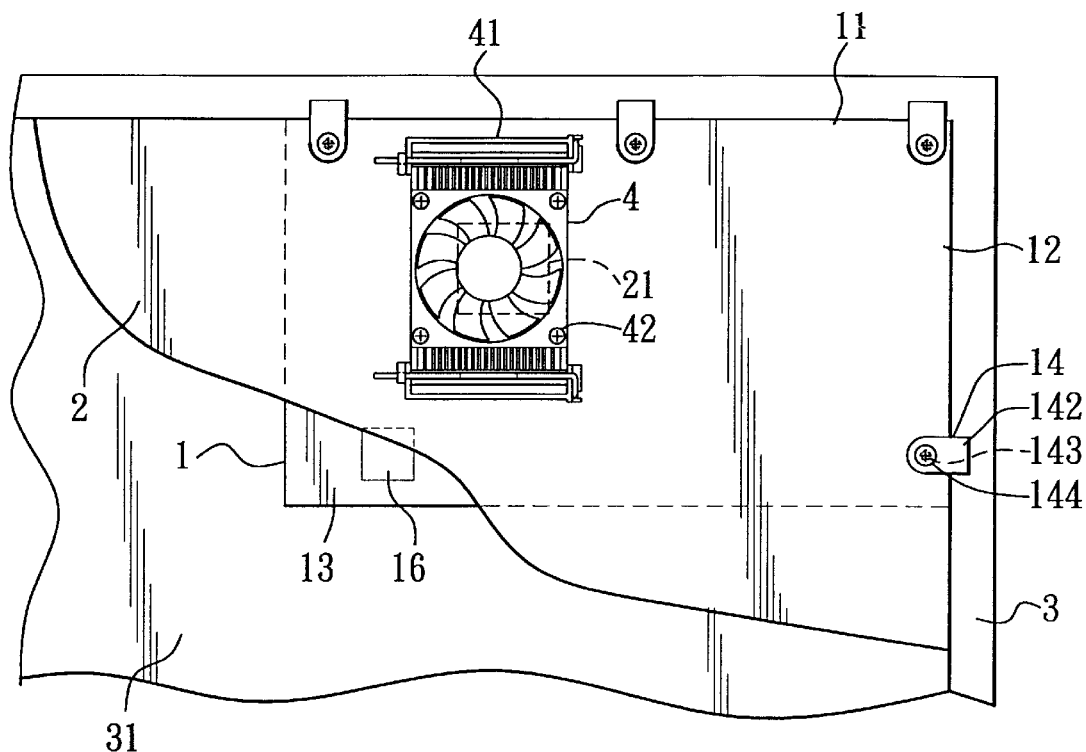
FIG. 4 is a fragmentary plan view of the preferred embodiment of a secured reinforcing support device according to the present invention in an assembled state.
Figure 5:
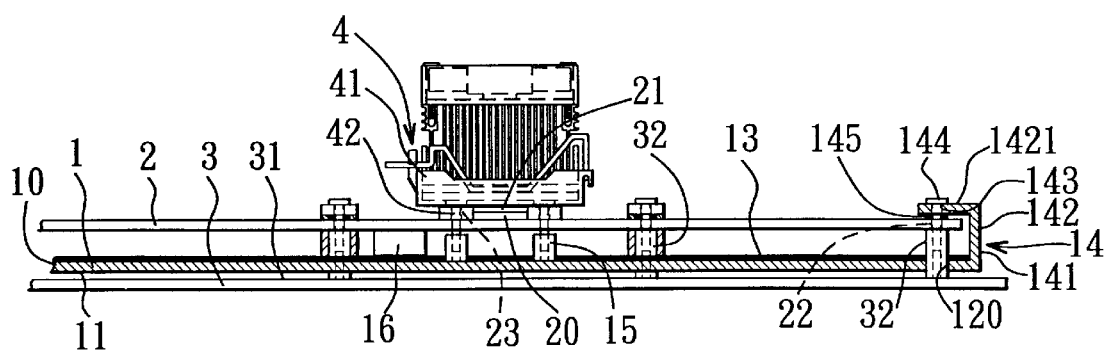
FIG. 5 is a fragmentary side view of the preferred embodiment in the assembled state.

With reference to FIGS. 4 and 5, a secured reinforcing support device is shown to bear the mass of a heat sink 4 used for absorbing and dissipating heat from a central processing unit 21 of a computer (not shown). The central processing unit 21, such as a Pentium 4 (P4) CPU, is mounted on a motherboard 2 housed in a casing 3 near a corner of the casing 3. The motherboard 2 has first upper and lower major surfaces opposite to each other in an upright direction. The first upper major surface has a loaded area and a peripheral area surrounding the loaded area. The central processing unit 21 is mounted on the loaded area of the first upper major surface via a socket 20 disposed below the central processing unit 21. The heat sink 4, such as a P4-specific heat sink, is disposed to be spaced apart from the loaded area in the upright direction, and is superimposed on the central processing unit 21 to absorb and dissipate the heat generated thereby. A seat mount 41 is disposed to bear and localize the heat sink 4 in the loaded area. The casing 3, such as an ATX standard computer casing, includes a bottom major wall surface 31 disposed under the first lower major surface and spaced apart from the first lower major surface in the upright direction to form an accommodation space.

The secured reinforcing support device is shown to include a reinforcing support plate 1, a support post 32, a bracing member 14 and a tightening shaft 144. The support plate 1 is substantially rectangular and is formed from metal with a thickness of approximately 1 mm. The support plate 1 is disposed in the accommodation space such that it is substantially parallel to the motherboard 2, and includes second upper and lower major surfaces 10, 11 opposite to each other in the upright direction. The second upper and lower major surfaces 10, 11 are respectively spaced apart from the first lower major surface of the motherboard 2 and the bottom major wall surface 31 of the computer casing 3. The second upper major surface 10 includes central and surrounding areas which correspond to and which are positioned under the loaded area and the peripheral area, respectively. The central area supports and is connected to the seat mount 41 through the loaded area. The surrounding area includes at least one through hole 120 extending downward to communicate with the second lower major surface 11. In this embodiment, four through holes 120 are formed in adjacent edge portions 11, 12 of the surrounding area, which correspond to two adjacent sides of the motherboard 2 near the corner of the casing 3. It is noted that the number and arrangement of the through holes 120 can be altered as desired. The second upper major surface 10 of the support plate 1 is provided with an insulating layer 13 to space the support plate 1 apart from the first lower major surface so as to prevent short circuit and scratching of the first lower major surface of the motherboard 2. The insulation layer 13 is preferably formed from a fire-proof material.

The support post 32 includes a lower end adapted to be secured to the bottom major wall surface 31, and an upper end extending from the lower end upwardly and in the upright direction. The upper end is dimensioned to pass through the through hole 120 so as to abut against the first lower major surface, and has a fastening bore extending axially and towards the lower end and defining an axis. In this embodiment, four support posts 32 are provided to match the four through holes 120.

An inner peripheral wall is adapted to be disposed in the motherboard 2 to define an insert hole 22 which extends along the axis to communicate the first upper major surface with the first lower major surface. In this embodiment, four insert holes 22 are formed in the motherboard 2.

The bracing member 14 includes a joining end 141 disposed to be integrally formed with the reinforcing support plate 1 at the surrounding area, and a clamped portion 142 with a clamped end 1421. The clamped portion 142 extends from the joining end 141 upwardly and in the upright direction such that the clamped end 1421 is adapted to be disposed on the first upper major surface and adjacent to the inner peripheral wall. The clamped portion 142 is adapted to be spaced apart from the motherboard 2 to define a clearance therebetween, which is approximately 1 mm in this embodiment. The clamped end 1421 is further formed with a through bore 143 which is coaxial with the insert hole 22, and has a lower surface provided with an insulating layer 145 to space the clamped end 142 apart from the first upper major surface so as to avoid scratching of the first upper major surface and occurrence of short circuit. Preferably, the insulating layer 145 is formed from a fire-proof material. In this embodiment, four bracing members 14 are provided.

The tightening shaft 144 is disposed to pass through the insert hole 22 and to be threadedly engaged with the fastening bore of the support post 32 such that when the tightening shaft 144 is in full engagement with the insert hole 22, the clamped end 1421 is forced to abut against the first upper major surface. As shown in FIG. 5, the tightening shaft 144 has a head portion and passes through the through bore 143 in the clamped end 1421 and the insert hole 22 to be retained in the fastening bore of the support post 32 such that the head portion abuts against the clamped end 1421, which in turn abuts against the first upper major surface.

The secured reinforcing device further includes a shock absorbing pad 16 disposed on the second upper major surface 10 at an end distal to the bracing member 14 and in contact with the first lower major surface so as to help stabilize the support plate 1 when the support plate 1 is subjected to an impact force, while preventing the support plate 1 from abutting against the motherboard 2 directly. In this embodiment, the shock absorbing pad 16 is formed from rubber and is bonded to the second upper major surface 10 of the support plate 1.

Furthermore, the support plate 1 includes a plurality of heat sink mounting posts 15 projecting from the second upper major surface 10 thereof. A plurality of threaded bolts 42 extend through threaded holes 23 formed in the motherboard 2 to engage threadedly the mounting posts 15, thereby securing the heat sink 4 on both the motherboard 2 and the support plate 1.

By virtue of the arrangement of the bracing member 14 and the tightening shaft 144 which engages the support post 32 mounted on the bottom major wall surface 31 of the casing 3, a large part of the weight of the heat sink 4 can be indirectly borne by the casing 3, thereby reducing the load of the heat sink 4 on the motherboard 2 and reinforcing the positioning of the heat sink 4 so as to prevent undesirable displacement of the support plate 1 upon impact. Besides, the present invention can be adapted for use in conjunction with P4-specific heat sinks.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A secured reinforcing support device which helps bear mass of a heat sink used for absorbing and dissipating heat from a central processing unit of a computer, the computer further including a motherboard which has first upper and lower major surfaces opposite to each other in an upright direction, the first upper major surface having a loaded area and a peripheral area surrounding the loaded area, the central processing unit being mounted on the loaded area, a heat sink disposed to be spaced apart from the loaded area in the upright direction, and superimposed on the central processing unit to absorb and dissipate heat therefrom, a seat mount disposed to bear and localize the heat sink in the loaded area, and a casing for housing the motherboard, including a bottom major wall surface disposed under the first lower major surface and spaced apart from the first lower major surface in the upright direction to form an accommodation space, said secured reinforcing support device comprising:

a reinforcing support plate adapted to be disposed in the accommodation space and including second upper and lower major surfaces opposite to each other in the upright direction, and adapted to be respectively spaced apart from the first lower major surface and the bottom major wall surface, said second upper major surface including central and surrounding areas, which are adapted to respectively correspond to and be positioned under the loaded area and the peripheral area, said central area being further adapted to support and be connected to the seat mount through the loaded area, wherein said surrounding area includes a through hole extending downward to communicate with said second lower major surface;

a support post including a lower end adapted to be secured to the bottom major wall surface, and an upper end extending from said lower end upwardly and in the upright direction, said upper end being dimensioned to pass through said through hole so as to abut against the first lower major surface, and having a fastening bore extending axially and towards said lower end and defining an axis;

an inner peripheral wall adapted to be disposed in the motherboard to define an insert hole which extends along said axis to communicate the first upper major surface with the first lower major surface;

a bracing member including a joining end disposed to be integrally formed with said reinforcing support plate at said surrounding area, and a clamped portion with a clamped end, said clamped portion extending from said joining end upwardly and in the upright direction such that said clamped end is adapted to be disposed on the first upper major surface and adjacent to said inner peripheral wall; and a tightening shaft disposed to pass through said insert hole and to be threadedly engaged with said fastening bore such that when said tightening shaft is in full engagement with said insert hole, said clamped end is forced to abut against the first upper major surface.

2. The secured reinforcing support device according to claim 1, wherein said reinforcing support plate is made of metal.

3. The secured reinforcing support device according to claim 1, wherein said second upper major surface of said reinforcing support plate is provided with an insulating layer.

4. The secured reinforcing support device according to claim 1, wherein said clamped end has a lower surface provided with an insulating layer to space said clamped end apart from the first upper major surface.

5. The secured reinforcing support device according to claim 1, further comprising a shock absorbing pad disposed on said second upper major surface at an end distal to said bracing member and in contact with the first upper major surface.

6. The secured reinforcing support device according to claim 1, wherein said clamped portion is disposed to be spaced apart from the motherboard.

7. The secured reinforcing support device according to claim 1, wherein said clamped end is formed with a through bore which is coaxial with said insert hole, said tightening shaft extending through said through bore, said insert hole and said fastening bore.

8. The secured reinforcing support device according to claim 1, wherein said reinforcing support plate is substantially parallel to the motherboard.

* * * * *